United States Patent [19]

Iwamuro

[11] Patent Number: 5,306,929
[45] Date of Patent: Apr. 26, 1994

[54] MOS CONTROLLED THYRISTOR
[75] Inventor: Noriyuki Iwamuro, Kawasaki, Japan
[73] Assignee: Fuji Electric Co., Ltd., Kawasaki, Japan
[21] Appl. No.: 806,257
[22] Filed: Dec. 13, 1991
[30] Foreign Application Priority Data Dec. 28, 1990 [JP] Japan .................. 2-408559

[51] Int. Cl.$^5$ .................. H01L 29/74; H01L 31/111
[52] U.S. Cl. .................. 257/147; 257/139; 257/138; 257/143; 257/149
[58] Field of Search .................. 357/38, 38 G, 38 C, 357/38 A, 38 S, 38 CA, 23.4, 39; 257/139, 138, 147, 149, 152, 143

[56] References Cited

U.S. PATENT DOCUMENTS

| | | | |
|---|---|---|---|
| 4,611,128 | 9/1986 | Patalong | 357/39 |
| 4,841,345 | 6/1989 | Majumdar | 357/38 |
| 4,961,099 | 10/1990 | Roggwiller | 357/38 |
| 5,132,767 | 7/1992 | Ogura et al. | 357/38 |

OTHER PUBLICATIONS

"MOS Controlled Thyristors (MCT's)", Temple, General Electric Company, Corporate Research and Development Center, Schenectady, N.Y. IEDM 84 (1984), pp. 282-285.

Primary Examiner—Rolf Hille
Assistant Examiner—Wael Fahmy
Attorney, Agent, or Firm—Spencer, Frank & Schneider

[57] ABSTRACT

An MCT (MOS controlled thyristor) including a first outer layer of a first conductivity type whose surface contacts a first major electrode, and a second outer layer at which an MOS structure is disposed, and whose surface contacts a second major electrode. The MCT is provided with a second conductivity type region formed in the first outer layer in such a manner that it contacts the first major electrode, but does not contact an inner layer adjacent to the first layer. The MCT has a low on-resistance, a small turn-off loss, and can prevent a negative resistance phenomenon from occurring.

3 Claims, 4 Drawing Sheets

MOS CONTROLLED THYRISTOR

BACKGROUND OF THE INVENTION

1. Field of the Invention

The present invention relates to a voltage driven type MOS controlled thyristor and method for fabricating the same which has a four layer pnpn structure turned on and which off by two MOS gates, and is used as a power switching device.

2. Description of the Prior Art

Gate-turnoff thyristors (GTOS) that can be turned off by a gate signal are extensively employed. A GTO, however, has a disadvantage in that it requires a relatively large gate-driving power to turn off because it is a current driven device. To overcome this disadvantage, a voltage driven MOS gate transistor is proposed. An MOS gate transistor, like an insulated gate bipolar transistor (IGBT), has a structure to drive a wide base transistor by an MOS gate. An MOS gate thyristor, however, differs from an IGBT in that, although an IGBT does not latch the inner parasitic thyristor does, an MOS gate thyristor latch it so that not only the gate voltage but also the anode voltage must be reversed to turn-off the device.

MOS controlled thyristors (MCT) have been proposed which use voltage driven MOS gates to turn on and off the device. The MCT has a structure such that MOSFETS incorporated into the pnpn thyristor turn on and off the thyristor. More specifically, as shown in FIG. 1, on a low resistivity n+ layer (a first layer) 1, a low resistivity p+ layer (a second layer) 2 is formed, which is followed by a high resistivity p− layer (a third layer) 3. In the surface of the p− layer 3, an n layer (a fourth layer) 4 is selectively formed, and then, in the surface of the n layer 4, a p layer (a fifth layer) 5 is selectively formed. Subsequently, in the surface of the p layer 5, a p+ layer (a sixth layer) 6 and n+ layers (seventh layers) 7 are selectively formed. In addition, gate electrodes 9 are formed, via gate insulating films 8, on surface regions 15 of the n layer 4 between the p layer 5 and the p− layer 3, and on surface regions 17 of the p layer 5 between the n+ layer 7 and the n layer 4 so that the surface regions 15 and 17 form channel regions. Further, an anode electrode 10 making contact with the surface of both the p+ layer and the n+ layers 7, and a cathode electrode making contact with the n+ layer 1 are provided. The anode electrode 10 is insulated from the gate electrodes 9 with insulating layers 12.

This MCT is activated by applying a voltage to the gate electrodes 9 and the cathode electrode 11 with the anode electrode being grounded. To turn on the MCT,, a negative voltage is applied to the gate electrodes 9 so that p channels are formed in the surface regions 15 of the n layer 4 between the p layer 5 and the p− layer 3. Thus, holes flow through the p channels toward the cathode electrode 11 when a negative voltage is applied to the cathode electrode 11, thereby turning on the n+/p+ junction 19 between the n+ layer 1 and the p+ layer 2, and resulting in injection of electrons from the n+ layer 1 into the p+ layer 2. The electrons, passing through the p− layer 3 and the n layer 4, turn on the p/n junction 21 between the n layer 4 and the p layer 5 and the p/n junction 23 between the n layer 4 and the p+ layer 6. Thus, hole injection from the p layer 5 and p+ layer 6 to the n layer 4 takes place, thereby turning on the npnp thyristor. The on resistance of the thyristor is low owing to conductivity modulation taking place in the p+ layer 2, p− layer 3 and the n layer 4.

To turn off the MCT, a positive voltage is applied to the gate electrodes 9 so that n channels are formed in the surface regions 17 of p layer 5 between the n+ layer 7 and the n layer 4. Thus, the n+ layer 7 and the n layer 4 become equipotential, which in turn makes the p+ layer 6 and the n layer 4 equipotential because the p+ layer 6 is connected to the n+ layer 7 via the anode electrode 10. As a result, although electrons injected into the p+ layer 2 from the n+ layer 1 reach the p/n junction 21 between the n layer 4 and the p layer 5, and the junction 23 between the n layer 4 and the p+ layer 6, they flow into the anode electrode 10 through the n channels in the surface regions 17 so that hole injection from the p layer 5 into the n layer 4 does not occur, thus completing the turn off operation. Similar operations take place in a complementary MCT which has opposite conductivity type layers to those of the above MCT, has an MOS structure at the side of a cathode electrode when voltages of the opposite polarity are applied.

It is preferable that the MCT have a high turn-off speed as a switching device. To improve the turn-off speed, it is necessary to quickly remove excess carriers stored in the p+ layer 2, p− layer 3 and the n layer 4 in the conducting state. One method of improve the turn-off speed is to employ a cathode short structure in which the p+ layer 2 is short-circuited to the n+ layer 1 by the cathode electrode 11. This structure has an advantage that excess carriers stored in the p+ layer during the conducting state are easily removed. The structure, however, has a disadvantage that conductivity modulation suddenly takes place after a certain time has elapsed at the initial stage of turning-on owing to the reduction in the electron injection from the n+ layer 1 to the p+ layer 2, and hence, a negative resistance phenomenon is liable to occur during transition from the off to the on state, resulting in an increase in turn-on loss. On the other hand, in a normal cathode structure without a cathode short hole that short-circuits the p+ layer 2 to the cathode electrode 11, the negative resistance phenomenon is eliminated. This structure, however, reduces the carrier removal effect at the turn-off operation, and increases the turn-off loss.

SUMMARY OF THE INVENTION

Accordingly, it is an object of the present invention to provide an MOS controlled thyristor and method for fabricating the same that can prevent the negative resistance phenomenon at the turn-on operation and reduce the turn-off loss by improving the trade off relationship between the turn-on loss and the turn-off operation.

In the first aspect of the present invention, an MOS controlled thyristor comprises:

a first layer of a heavily doped first conductivity type;

a second layer of a heavily doped second conductivity type, which is disposed on the first layer;

a third layer of a lightly doped second conductivity type, which is disposed on the second layer;

a fourth layer of a first conductivity type, which is selectively formed in a surface region of the third layer;

a fifth layer of a second conductivity type, which is selectively formed in a surface region of the fourth layer;

a sixth layer of a second conductivity type, which is selectively formed so as to protrude into the fourth layer through the fifth layer;

a seventh layer of a first conductivity type, which is selectively formed in the surface of the fifth layer so as to make contact with the sixth layer;

a first channel region formed in a surface of the fourth layer between the third and fifth layers;

a second channel region formed in a surface of the fifth layer between the fourth and seventh layers;

an insulating film formed on a surface of the first and second channels;

a gate electrode formed on the insulating film;

a first major electrode making contact with the first layer;

a second major electrode making contact with the sixth and seventh layers; and an eighth region of highly doped second conductivity type, which is selectively formed in the first layer so as to make contact with the first major electrode, but does not protrude into the second layer.

The contact area of the eighth region with the first major electrode may be at least 25% of the total contact area of the first major electrode with the first layer.

The depth of the eighth region may be equal to or less than 80% of the depth of the first layer.

In the second aspect of the present invention, a method for fabricating an MOS controlled thyristor the method includes fabrication of a multi-layer structure of alternate p-type and n-type layers, a first major electrode contacting a first outer layer of the multi-layer structure, a second major electrode contacting a second outer layer of the multi-layer structure at the opposite side of the first outer layer, and an MOS structure disposed in a surface of the second outer layer for controlling the turn-on and turn-off currents of the multi-layer structure. The method also comprises the step of forming in the first outer layer a highly doped region of the opposite conductivity type to that of the first outer layer in such a fashion that the highly doped region contacts the first major electrode, but does not protrude into an inner layer adjacent to the first layer in the multi-layer structure.

The contact area of the highly doped region with the first major electrode may be made at least 25% of the total contact area of the first major electrode with the first layer.

The depth of the highly doped region may be made equal to or less than 80% of the depth of the first layer.

According to the present invention, the eighth region is not connected to the second region. Thus, the first region remains between the eighth and second regions so that a complete cathode short or anode short is not formed. To turn on the device, a voltage of about 0.8 V corresponding to the diffusion potential of the junction between the first region of the first conductivity type and the second region of the second conductivity type is applied to the first major electrode. In this condition, the minority carrier injection from the first region to the second and third regions surely takes place so that no negative resistance phenomenon occurs. On the other hand, when the device is turned off, the majority carriers, which are stored in the second and third regions, and are removed by the change dV/dt in the voltage of the first major electrode, chiefly flow toward the first major electrode through the eighth region so that the reinjection of the minority carriers from the first region is restricted. Thus, the turn-off current is reduced, resulting in the reduction in the turn-off loss.

The above and other objects, effects, features and advantages of the present invention will become more apparent from the following description of the embodiments thereof taken in conjunction with the accompanying drawings.

DESCRIPTION OF THE PREFERRED EMBODIMENT

The invention will now be described with reference to the accompanying drawings.

Figure 1:
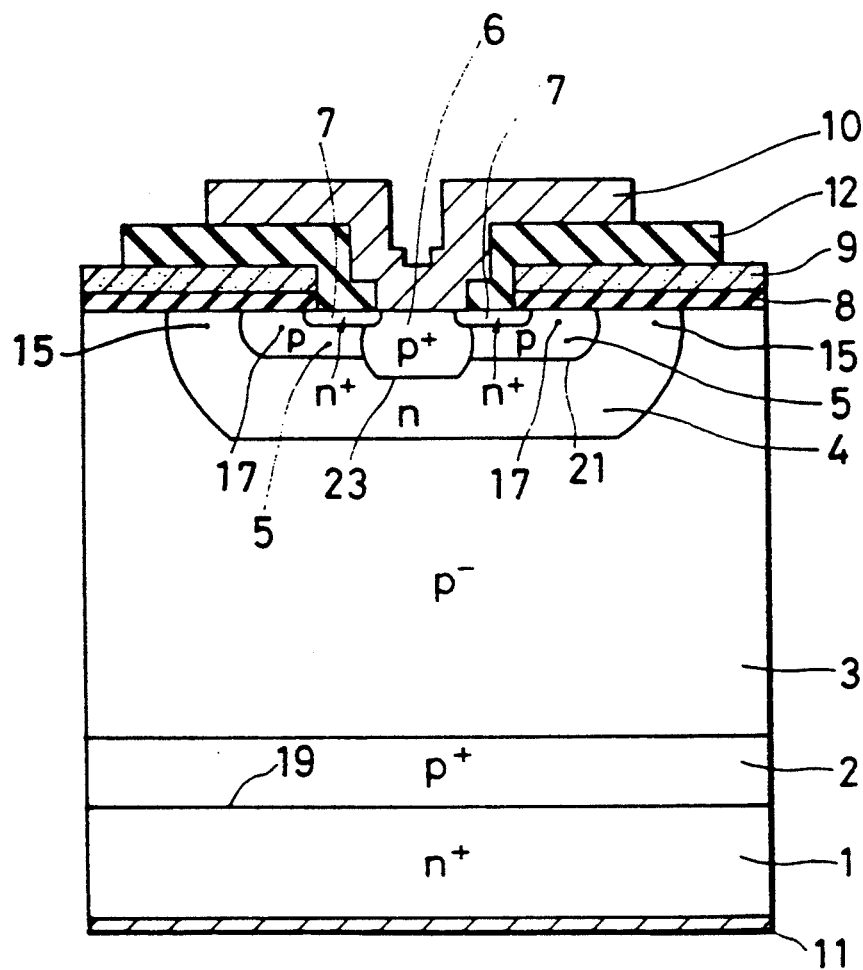
FIG. 1 is a cross sectional view showing the structure of a conventional MCT.
Figure 2:
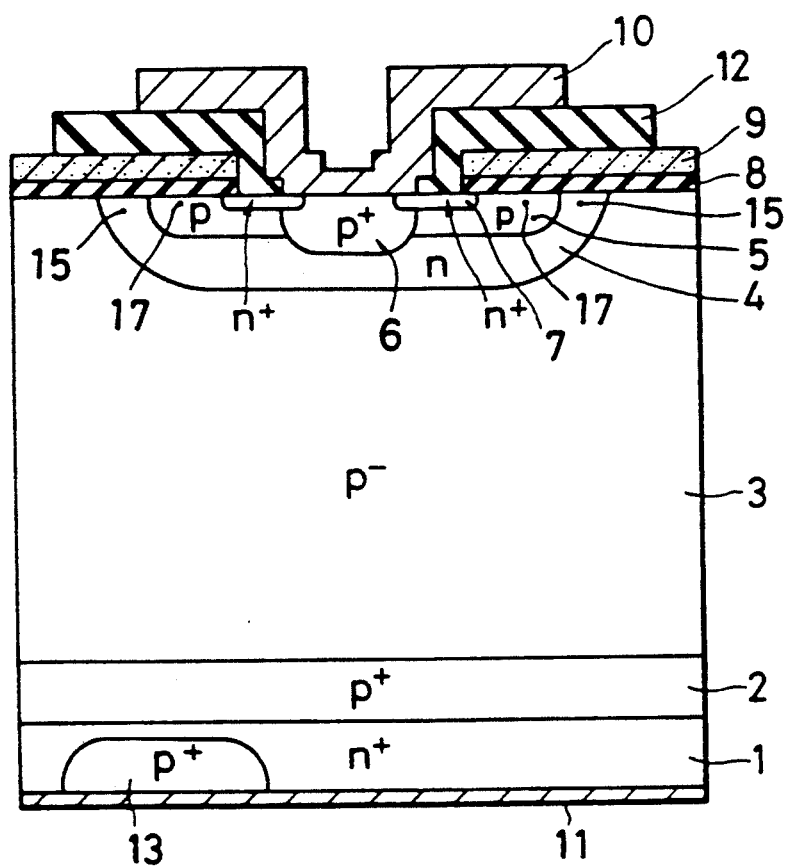
FIG. 2 is a cross sectional view showing an embodiment of an MCT according to the present invention.

FIG. 2 is a cross sectional view showing an embodiment of an MCT according to the present invention, in which the same parts as those of FIG. 1 are designated by the same reference numerals: reference numerals 1 to 7 designate the to seventh regions, respectively. The MCT of the embodiment of the invention shown in FIG. 2 differs from that of FIG. 1 in that a shallow p+ region (the eighth region) 13, thinner than the n+ layer 1, is embedded in a part of the n+ layer 1. This device is fabricated by the following steps.

First, a p+ layer 2 of 20 $\mu$m thickness, and a p− layer 3 of 180 $\mu$m thickness are sequentially deposited on the surface of an n+ substrate (n+ layer) 1 by using an epitaxial-growth process. Here, the resistivities of the n+ layer 1, the p+ layer 2 and the p− layer 3 are 0.01 $\Omega$-cm, 0.1 $\Omega$-cm and 200 $\Omega$-cm, respectively.

Second, a polysilicon layer of 1.0 $\mu$m thickness is formed on the surface of the p− layer 3 via a gate oxide film 8. The polysilicon layer is patterned to form gate electrodes 9.

Third, an n layer 4 is formed by phosphorous ion implantation using the gate electrodes 8 as masks, and by subsequent annealing. Here, a typical ion energy of the ion implantation is 100 keV, and a typical ion dose is $8.0 \times 10^{13}$ ions cm$^2$. The annealing is typically performed for 5 hours at 1,150° C.

Fourth, a p layer 5, a p+ layer 6 and n+ layers 7 are sequentially formed by an ion implantation process using as masks the gate electrodes 8 and resist films as needed, and by a subsequent annealing process. Here, a typical ion energy of the boron ion implantation for forming the p layer 5 is 150 keV, and a typical ion dose is $1.0 \times 10^{14}$ ions/cm$^2$. The annealing for forming the p layer 5 is typically conducted for 3 hours at 1,100° C. A typical ion energy of the boron ion implantation for forming the p+ layer 6 is 150 keV, and a typical ion dose is 2.0 ×10^14 ions/cm². The annealing for forming the p+ layer 6 is carried out for 4 hours at 1,100° C. A typical ion energy of the arsenic ion implantation for forming the n+ layer 7 is 120 keV, and a typical ion dose is 5.0×10^15 ions/cm². The annealing for forming the n+ layer 7 is typically performed for 1 hour at 1,000° C.

Fifth, a p+ region 13 is formed in the n+ layer 1 by means of boron ion implantation and by subsequent annealing. The ion implantation is conducted from the surface of the n+layer using an oxide mask formed on that surface. Here, a typical ion energy of the boron ion implantation is 120 keV, and a typical ion dose is 2.5×10^15 ions/cm². The annealing is typically performed for 3 hours at 1,100° C.

Finally, insulating films 12 are formed by using PSG (phosphosilicate glass) of 1.2 μm thickness and LTO of 1.5 μm thickness, and an anode electrode 10 and a cathode electrode 11 are made of Al - 1% (at%) Si evaporation film.

Although the resistivity of the n+ layer 1, and the resistivities and thicknesses of the p+ layer 2 and the p− layer 3 are equal to those of the conventional example described before, the thickness of the n+ layer is specified at 5 μm and the p+ region 13 is embedded 3 μm thick in the n+ layer 1. The p+ region 13 has a surface impurity concentration of 2.0×10^19/cm³, and a surface area equal to 30% of the entire area of the cathode electrode 11.

Figure 3:
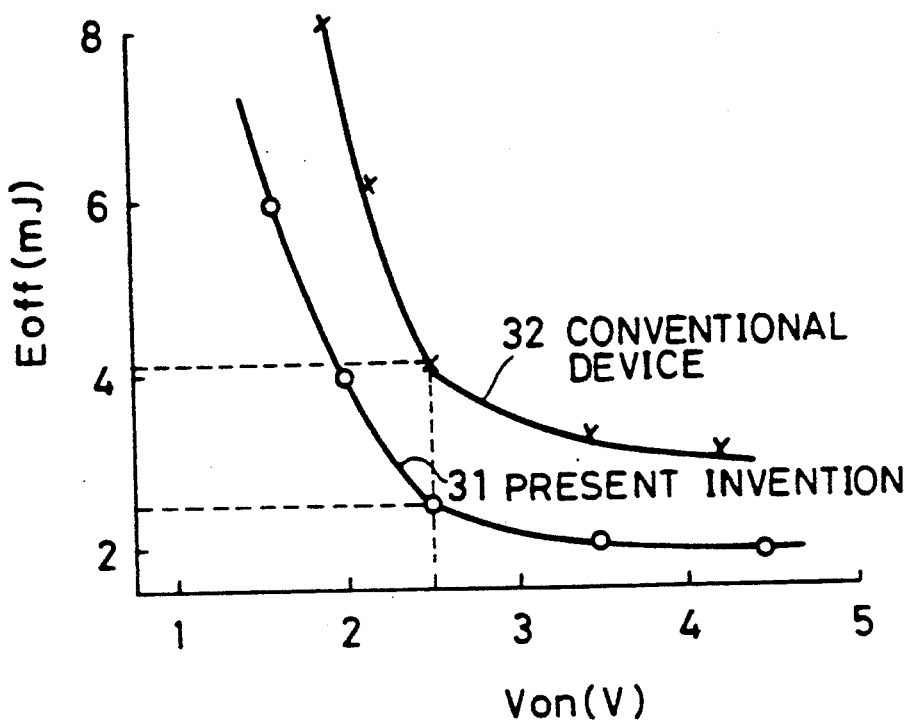
FIG. 3 is a graph comparatively illustrating curves of trade-off characteristics between the ON-voltage and the turn-off loss of the MCT of the invention and the conventional MCT.

FIG. 3 is a graph comparatively illustrating trade-off curves between the ON-voltage Von and the turn-off loss Eoff of the embodiment of the MCT of the present invention and the conventional MCT as shown in FIG. 1. Reference numeral 31 denotes the curve of the MCT of the present invention, and reference numeral 32 designates that of the conventional MCT. From FIG. 3, it is clear that the MCT of the present invention has superior trade-off characteristics to those of the conventional MCT: for example, at Von = 2.5 V, Eoff is reduced by about 40%.

Figure 4:
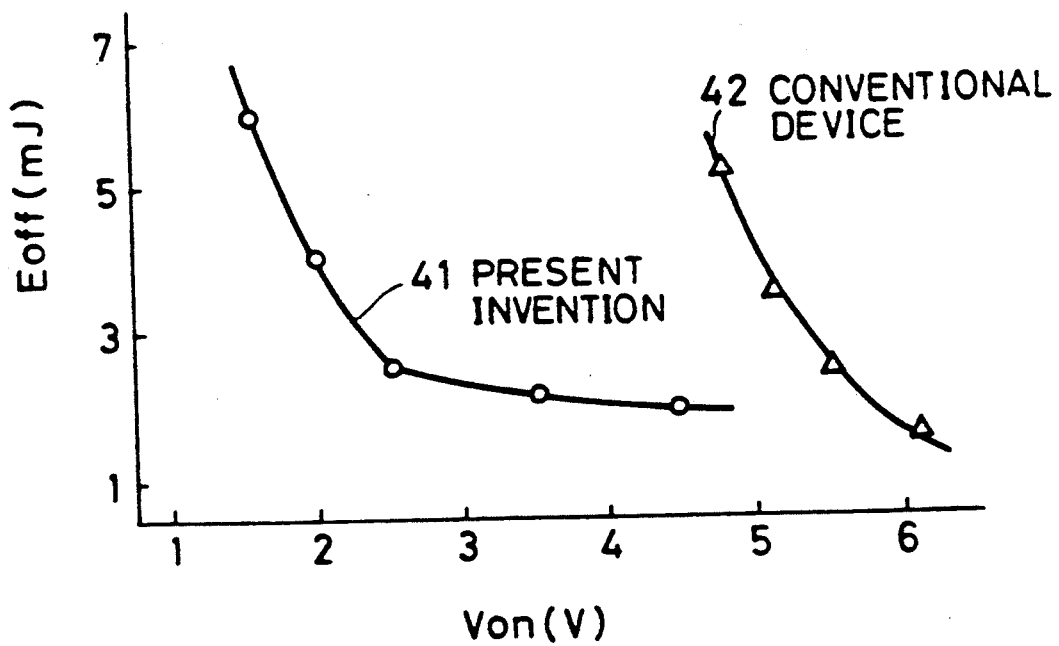
FIG. 4 is a graph comparatively illustrating curves of trade-off characteristics between the ON-voltage and the turn-off loss of the MCT of the invention and a conventional cathode short type MCT.

FIG. 4 is a graph illustrating by comparison the trade-off curves between the ON-voltage Von and turn-off loss Eoff of the embodiment of the MCT of the present invention and a conventional MCT having cathode short holes in the entire area of the n+ layer 1. Reference numeral 41 denotes the curve of the MCT of the present invention, and reference numeral 42 designates that of the conventional MCT. From FIG. 4, it is clear that the MCT of the present invention has superior trade-off characteristics to those of the cathode short type MCT: for example, at Eoff = 3, Von is reduced by about 2.3 V.

Figure 5:
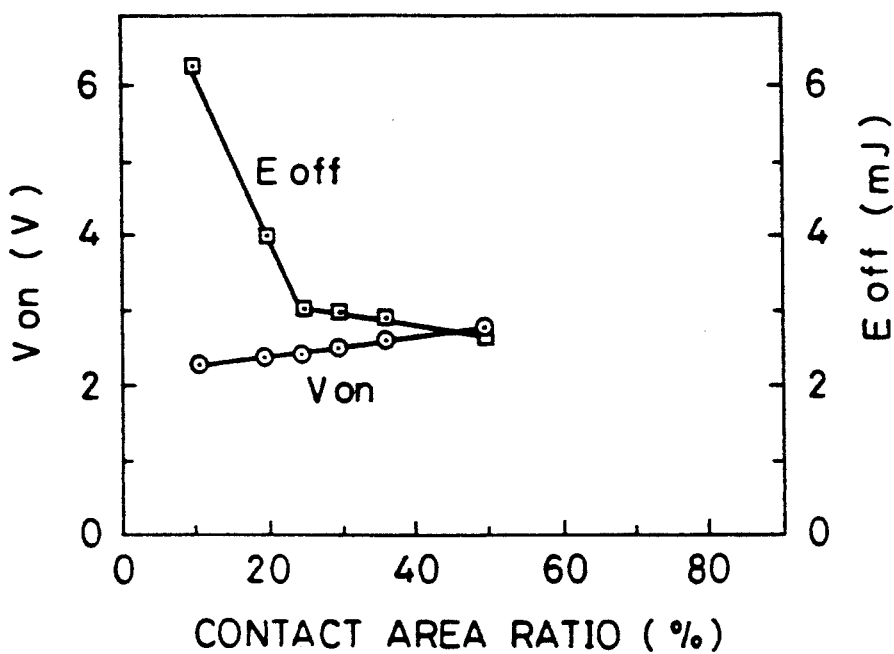
FIG. 5 is a graph illustrating the relationship between the contact area ratio of the cathode electrode, and the ON-voltage and turning-off loss.

When the contact area ratio of the p+ region 13 to the cathode electrode 11 is reduced in the structure of FIG. 2, Eoff increases although Von decreases as shown in FIG. 5. In FIG. 5, the abscissa represents the contact area ratio of the p+ region 13 to the cathode electrode 11, and the ordinate represents the ON-voltage Von and the turn-off loss Eoff. As is clear from FIG. 5, the contact area ratio is preferably 25% or more.

Figure 6:
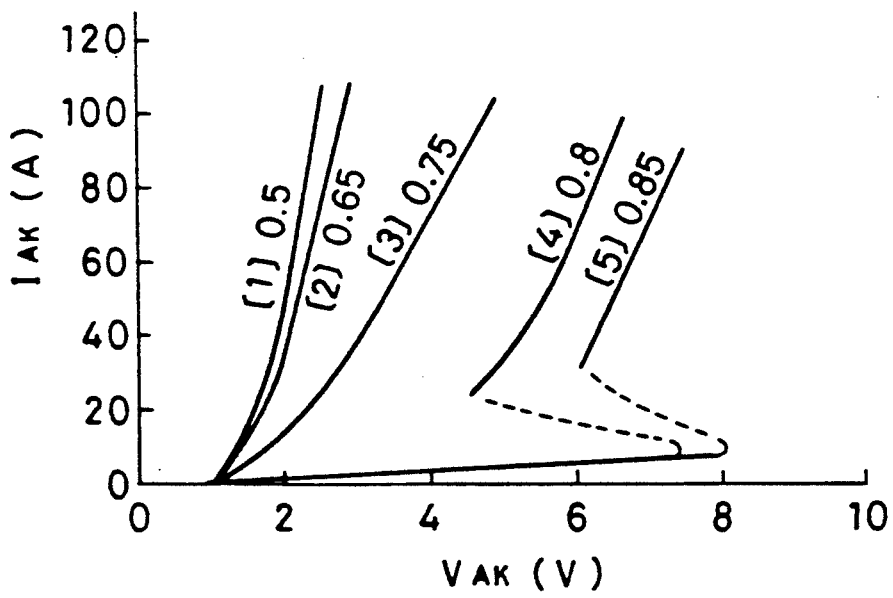
FIG. 6 is a graph illustrating the relationship between the voltage and current of an MCT of the embodiment when the thickness ratio of the eighth region (a p+ region 13) to that of the n+ layer 1 is varied.

Furthermore, although the turn-off loss Eoff declines as the thickness ratio of the p+ region 13 to the n+ layer 1 increases, a negative resistance phenomenon is liable to occur when the ratio exceeds 80% as shown in FIG. 6. In FIG. 6, the abscissa represents the ON-voltage between the anode and cathode, the ordinate represents the current flowing through the device, and the curves [11]–[51] are plotted for the ratios 0.5, 0.65, 0.15, 0.8 and 0.85. It is seen from FIG. 6 that the ratio (the depth of the p+ region 13) / (the depth of the n+ layer 1) is preferably less than 80%.

Although the above embodiment is described with regard to an MCT in which an MOS structure is disposed at the anode electrode side, the present invention can also be applied to an MCT in which the MOS structure is disposed at a cathode electrode side by forming an n+ region in a p layer making contact with the anode electrode.

The present invention has been described in detail with respect one embodiment of the invention, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A MOS controlled thyristor comprising:
    a first layer of a heavily doped first conductivity type;
    a second layer of a heavily doped second conductivity type disposed on said first layer;
    a third layer of a lightly doped second conductivity type disposed on said second layer;
    a fourth layer of a first conductivity type selectively formed in a surface region of said third layer;
    a fifth layer of a second conductivity type selectively formed in a portion of a surface region of said fourth layer;
    a sixth layer of a second conductivity type selectively formed so as to protrude into said fourth layer through said fifth layer;
    a seventh layer of a first conductivity type selectively formed in a portion of a surface region of said fifth layer so as to make contact with said sixth layer;
    an insulating film formed on a portion of the surface region of said fourth layer between said third and fifth layers;
    a gate electrode formed on said insulating film;
    a first major electrode making contact with said first layer;
    a second major electrode making contract with said sixth and seventh layers; and
    an eighth region of highly doped second conductivity type selectively formed in said first layer so as to make contract with said first major electrode without protruding into said second layer and having a surface impurity concentration of 2.0×10^19/cm³, a contact area of said eighth region with said first major electrode being at least 25% of the total contact area of said first major electrode with said first layer, a first channel region being formed in the surface region of said fourth layer between said third and fifth layers when a voltage having a first polarity is applied between said gate electrode and said major electrodes, and a second channel region being formed in the surface region of said fifth layer between said fourth and seventh layers when a voltage having a second polarity is applied between said gate and major electrodes.

2. A MOS controlled thyristor as claimed in claim 1, wherein a depth of said eighth region is equal to or less than 80% of a depth of said first layer.

3. A MOS controlled thyristor comprising:
    a first layer of a heavily doped first conductivity type;

a second layer of a heavily doped second conductivity type disposed on said first layer;

a third layer of a lightly doped second conductivity type disposed on said second layer;

a fourth layer of a first conductivity type selectively formed in a surface region of said third layer;

a fifth layer of a second conductivity type selectively formed in a portion of a surface region of said fourth layer;

a sixth layer of a second conductivity type selectively formed so as to protrude into said fourth layer through said fifth layer;

a seventh layer of a first conductivity type selectively formed in a portion of a surface region of said fifth layer so as to make contact with said sixth layer;

an insulating film formed on a portion of the surface region of said fourth layer between said third and fifth layers;

a gate electrode formed on said insulating film;

a first major electrode making contact with said first layer;

a second major electrode making contract with said sixth and seventh layers; and an eighth region of highly doped second conductivity type selectively formed in said first layer so as to make contract with said first major electrode without protruding into said second layer, having a depth equal to or less than 80% of a depth of said first layer and an impurity concentration of $2.0 \times 10^{19} cm^3$, a first channel region being formed in the surface region of said fourth layer between said third and fifth layers when a voltage having a first polarity is applied between said gate electrode and said major electrodes, and a second channel region being formed in the surface region of said fifth layer between said fourth and seventh layers when a voltage having a second polarity is applied between said gate and major electrodes.

* * * * *